United States Patent
Mishina (10) Patent No.: US 10,175,746 B2
(45) Date of Patent: Jan. 8, 2019

(54) POWER CONSUMPTION CONTROL SYSTEM AND METHOD

(71) Applicant: MITSUBISHI HEAVY INDUSTRIES, LTD., Tokyo (JP)

(72) Inventor: Shunji Mishina, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 268 days.

(21) Appl. No.: 15/039,369

(22) PCT Filed: Oct. 16, 2014

(86) PCT No.: PCT/JP2014/077485
§ 371 (c)(1),
(2) Date: May 25, 2016

(87) PCT Pub. No.: WO2015/079819
PCT Pub. Date: Jun. 4, 2015

(65) Prior Publication Data
US 2017/0168552 A1 Jun. 15, 2017

(30) Foreign Application Priority Data
Nov. 27, 2013 (JP) .................. 2013-244534

(51) Int. Cl.
*G06F 1/32* (2006.01)
*G05B 19/418* (2006.01)
(Continued)

(52) U.S. Cl.
CPC ......... *G06F 1/3293* (2013.01); *G05B 19/418* (2013.01); *G05B 19/41865* (2013.01);
(Continued)

(58) Field of Classification Search
CPC ....................................................... G06F 1/32
See application file for complete search history.

(56) References Cited

U.S. PATENT DOCUMENTS

| 8,866,420 B2 | 10/2014 | Mishina |
| 8,918,194 B2 | 12/2014 | Kondo et al. |

(Continued)

FOREIGN PATENT DOCUMENTS

| CN | 102475003 A | 5/2012 |
| CN | 102596494 A | 7/2012 |

(Continued)

OTHER PUBLICATIONS

International Search Report and Written Opinion of the International Searching Authority (Forms PCT/ISA/210 and PCT/ISA/237), dated Jan. 20, 2015, for International Application No. PCT/JP2014/077485, together with an English translation thereof.

(Continued)

*Primary Examiner* — Tejal Gami
(74) *Attorney, Agent, or Firm* — Birch, Stewart, Kolasch & Birch, LLP (57) ABSTRACT

Provided are a power consumption control system and method that clarify the timing for carrying out each of a plurality of processes and thereby facilitate standby power control and the leveling of power consumption. To this end, PERT analysis is performed on the basis of process information that relates to a production line, process flexibility analysis is performed on the basis of the PERT analysis, process arrangement combinations and the total number of process arrangement combinations are determined on the basis of the process flexibility analysis, distributions of the total number of process arrangement combinations are determined for the process arrangement combinations, the process arrangement combination having the smallest distribution is selected from among the distributions, the processes are rearranged, and the progression of the processes is controlled on the basis of the rearranged processes.

4 Claims, 6 Drawing Sheets

(51) Int. Cl.
  *G06Q 50/04*   (2012.01)
  *G06Q 10/06*   (2012.01)
  *H02J 3/06*    (2006.01)
  *G01R 21/00*       (2006.01)
  *G06Q 50/06*       (2012.01)
  *H02J 3/00*        (2006.01)

(52) U.S. Cl.
  CPC .......... *G06F 1/3287* (2013.01); *G06F 1/3296* (2013.01); *G06Q 10/06* (2013.01); *G06Q 50/04* (2013.01); *H02J 3/06* (2013.01); *G01R 21/007* (2013.01); *G05B 2219/2639* (2013.01); *G05B 2219/32021* (2013.01); *G06Q 50/06* (2013.01); *H02J 2003/007* (2013.01); *Y02E 60/76* (2013.01); *Y02P 70/161* (2015.11); *Y02P 90/14* (2015.11); *Y02P 90/20* (2015.11); *Y02P 90/205* (2015.11); *Y02P 90/30* (2015.11); *Y02P 90/82* (2015.11); *Y04S 40/22* (2013.01)

(56) References Cited

U.S. PATENT DOCUMENTS

| | | |
|---|---|---|
| 2012/0102343 A1 | 4/2012 | Kondo et al. |
| 2012/0261989 A1* | 10/2012 | Mishina .............. G05B 19/416 307/35 |

FOREIGN PATENT DOCUMENTS

| | | |
|---|---|---|
| DE | 10 2008 040 440 A1 | 1/2010 |
| JP | 11-232332 A | 8/1999 |
| JP | 2011-156598 A | 8/2011 |
| JP | 4813632 B1 | 11/2011 |
| WO | WO 2011/093194 A1 | 8/2011 |
| WO | WO 2011/121934 A1 | 10/2011 |

OTHER PUBLICATIONS

Extended European Search Report issued in corresponding EP Application No. 14865932.9 dated Oct. 6, 2016.

Zhaojie Wang et al, "An integrated Optimization Model for Generation and Batch Production Load Scheduling in Energy Intensive Enterprise", 2012 IEEE Power and Energy Society General Meeting Jul. 1, 2012, pp. 1-8.

Office Action issued by the Chinese Patent Office dated Jun. 19, 2017 in Chinese Application No. 201480064337.7 withan English Translation.

* cited by examiner

Fig. 1

NODE ( N = 1,2,3 ··· )

------▶ CRITICAL PATH

| 2 | UPPER ROW: EARLIEST ACTIVITY START TIME |
| 5 | LOWER ROW: LATEST ACTIVITY START TIME |

Fig. 2

| PROCESS | POWER CONSUMPTION PE [kW] | NUMBER OF DAYS REQUIRED x [DAYS] | PROCESS PERIOD |  |  |  |  |  |  |  |  |  |  |  |
|---|---|---|---|---|---|---|---|---|---|---|---|---|---|---|---|
| | | (TIME) (0) | 1 (1) | 2 (2) | 3 (3) | 4 (4) | 5 (5) | 6 (6) | 7 (7) | 8 (8) | 9 (9) | 10 (10) | 11 (11) | 12 (12) | 13 (13) |
| P1 | 10 (2) | 2 | | | | | | | | | | | | | |
| P2 | 5 (1) | 3 | | | | | | | | | | | | | |
| P3 | 5 (1) | 4 | | | | | | | | | | | | | |
| P4 | 10 (2) | 3 | | | | | | | | | | | | | |
| P5 | 20 (4) | 5 | | | | | | | | | | | | | |
| P6 | 10 (2) | 3 | | | | | | | | | | | | | |
| P7 | 15 (3) | 4 | | | | | | | | | | | | | |
| P8 | 10 (2) | 5 | | | | | | | | | | | | | |
| P9 | 5 (1) | 3 | | | | | | | | | | | | | |
| SUM OF POWER CONSUMPTION $PE_{sum}$ [kW] | | | 30 (15) | 30 (15) | 42 (12) | 62 (7) | 62 (7) | 54 (9) | 70 (5) | 70 (5) | 59 (9) | 50 (10) | 42 (12) | 42 (12) | 42 (12) |

Fig. 3

| PROCESS $P_n$ | POWER CONSUMPTION PE [kW] | FLOAT PERIOD $t_n$ [DAYS] | NUMBER OF DAYS REQUIRED $x_n$ [DAYS] | \multicolumn{13}{c|}{PROCESS PERIOD} |
|---|---|---|---|---|---|---|---|---|---|---|---|---|---|---|---|---|
| | | | (TIME) | 1 (0) | 2 (1) | 3 (2) | 4 (3) | 5 (4) | 6 (5) | 7 (6) | 8 (7) | 9 (8) | 10 (9) | 11 (10) | 12 (11) | 13 (12) (13) |
| P1 | 10 (2) | 5 | 2 | | | | | | | | | | | | | |
| P2 | 5 (1) | 3 | 3 | | | | | | | | | | | | | |
| P3 | 5 (1) | 7 | 4 | | | | | | | | | | | | | |
| P4 | 10 (2) | 6 | 3 | | | | | | | | | | | | | |
| P5 | 20 (4) | 5 | 5 | | | | | | | | | | | | | |
| P6 | 10 (2) | 7 | 3 | | | | | | | | | | | | | |
| P7 | 15 (3) | 7 | 4 | | | | | | | | | | | | | |
| P8 | 10 (2) | 5 | 5 | | | | | | | | | | | | | |
| P9 | 5 (1) | 7 | 3 | | | | | | | | | | | | | |
| SUM OF POWER CONSUMPTION $PE_{sum}$ [kW] | | | | 15 | 15 | 10 | 35 | 25 | 35 | 30 | 30 | 20 | 35 | 30 | 30 | 30 |

Fig.6

POWER CONSUMPTION CONTROL SYSTEM AND METHOD

TECHNICAL FIELD

The present invention relates to a power consumption control system and a power consumption control method for managing and controlling consumption of electric power in a factory.

BACKGROUND ART

A typical power consumption management method of recent years for managing electric power in a factory includes monitoring power consumption of lines, analyzing a load status, and implementing countermeasures individually for lines and processes that involve large power consumption (inclusive of standby power).

PRIOR ART DOCUMENT

Patent Document

Patent Document 1: International Publication No. WO2011/121934 Pamphlet

SUMMARY OF THE INVENTION

Problems to be Solved by the Invention

However, information on correlations such as a sequence of processes is not enough from only the analysis and the countermeasures mentioned above. Accordingly, the information is inadequate for constantly leveling peak power in the facility as a whole. In the meantime, the standby power that does not contribute to operation accounts for a non-negligible percentage in the entire power consumption. In the light of effectively controlling the standby power, it is difficult to find timing right for reducing the standby power.

The present invention has been made in view of the aforementioned problem. An object of the present invention is to provide a power consumption control system and a power consumption control method which clarify timing for carrying out each of processes and thereby achieving leveling of power and facilitation of standby power control.

Means for Solving the Problems

A power consumption control method according to a first invention which solves the above-mentioned problems comprises: performing a PERT (program evaluation and review technique) analysis, regarding a production line including a plurality of processes to be carried out by a plurality of line instruments, on a process period of the production line based on process information including at least a required period of each of the processes, and a sequence of the processes; performing a process float analysis to obtain a float period for each of the processes based on the PERT analysis; obtaining combinations of the required periods arrangeable within the float periods for the respective processes based on the process float analysis, then obtaining process arrangement combinations being combinations of all the processes used in the combinations of the required periods, and obtaining a total process arrangement combination number being a total number of the process arrangement combinations; obtaining a sum of power consumption per unit period of the process period for each of the process arrangement combinations based on power consumption per unit period of each of the processes, and obtaining a variance of the sum with respect to set power per unit period being set to the process period, thus obtaining the variances for the total process arrangement combination number; selecting one of the process arrangement combinations which minimizes the variance among all the variances obtained; and controlling progress of the plurality of processes based on the selected process arrangement combination, and turning off power of the line instruments to carry out the plurality of processes during a period not allocated to the process period for the processes.

A power consumption control method according to a second invention which solves the above-mentioned problems is the power consumption control method mentioned in the first invention, wherein the power consumption of each of the plurality of line instruments is measured in real time, and when the measured power consumption exceeds predetermined target power, at least one of a rotational acceleration/deceleration rate and a rotational speed of a motor used in the corresponding line instrument is reduced so as not to cause the power consumption to exceed the target power.

A power consumption control system according to a third invention which solves the above-mentioned problems comprises: inputting means for inputting process information regarding the production line including the plurality of processes to be carried out by the plurality of line instruments, the process information including at least the required period of each of the processes, the sequence of the processes, and the power consumption per unit period of each of the processes; and controlling means for controlling the plurality of line instruments based on the process information inputted from the inputting means, and the controlling means performs the PERT (program evaluation and review technique) analysis on the process period based on at least the required periods and the sequence of the processes, performs the process float analysis to obtain the float period for each of the processes based on the PERT analysis, obtains combinations of the required periods arrangeable within the float periods for the respective processes based on the process float analysis, then obtains the process arrangement combinations being combinations of all the processes used in the combinations of the required periods, and obtains the total process arrangement combination number being the total number of the process arrangement combinations, obtains the sum of the power consumption per unit period of the process period for each of the process arrangement combinations based on the power consumption, and obtains the variance of the sum with respect to the set power per unit period being set to the process period, thus obtaining the variances for the total process arrangement combination number, selects one of the process arrangement combinations which minimizes the variance among all the variances obtained; and controls the plurality of line instruments in such a way as to control progress of the plurality of processes based on the selected process arrangement combination, and turn off power of the line instruments to carry out the plurality of processes during a period not allocated to the process period for the processes.

A power consumption control system according to a forth invention which solves the above-mentioned problems is the power consumption control system mentioned in the third invention, wherein the system further comprises power measuring means for measuring power consumption of each of the plurality of line instruments in real time, and inputting the measured power consumption to the controlling means, and when the measured power consumption exceeds predetermined target power, the controlling means performs control in such a way as to reduce at least one of a rotational acceleration/deceleration rate and a rotational speed of a motor used in the corresponding line instrument so as not to cause the power consumption to exceed the target power.

Effect of the Invention

According to the present invention, it is possible to clarify timing for carrying out each of the processes by using the PERT (program evaluation and review technique) method, and thus to achieve the leveling of the power consumption and the facilitation of the standby power control.

MODE FOR CARRYING OUT THE INVENTION

A power consumption control system and a power consumption control method according to the present invention clarify timing to operate each of processes and thereby achieving leveling of power consumption and facilitation of standby power control, by using the PERT method which is a production management operation method.

Here, the "PERT" is a technique used for planning a product development schedule. This is a method of: representing complicated process sequence relations of activities in the form of a network by using an arrow diagram; clarifying a path (a critical path) with which there is no float for processing the activities from a start to an end of a project; examining a feasibility of the plan for completing the project on or before a scheduled work period; and thus clarifying management key points.

Figure 1:
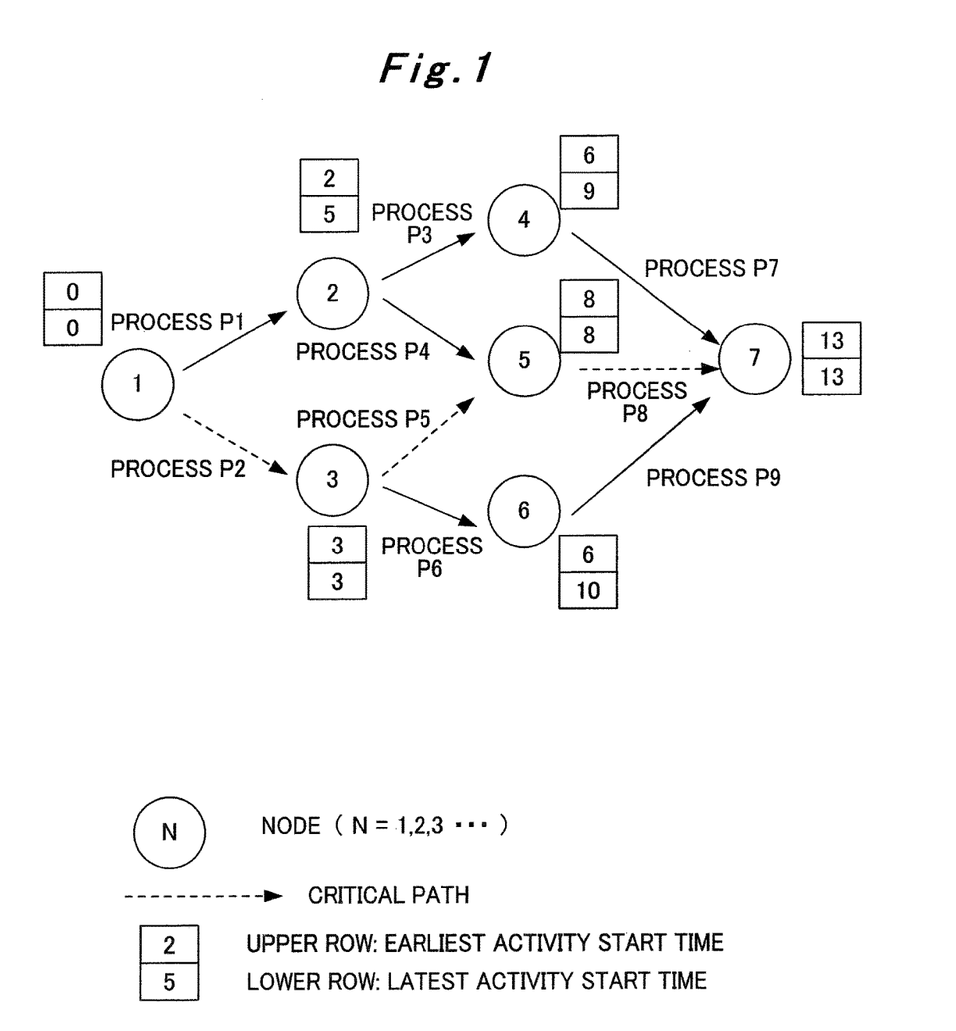
FIG. 1 is a PERT analysis chart showing an example of a PERT analysis according to a power consumption control system and a power consumption control method of the present invention.
Figure 2:
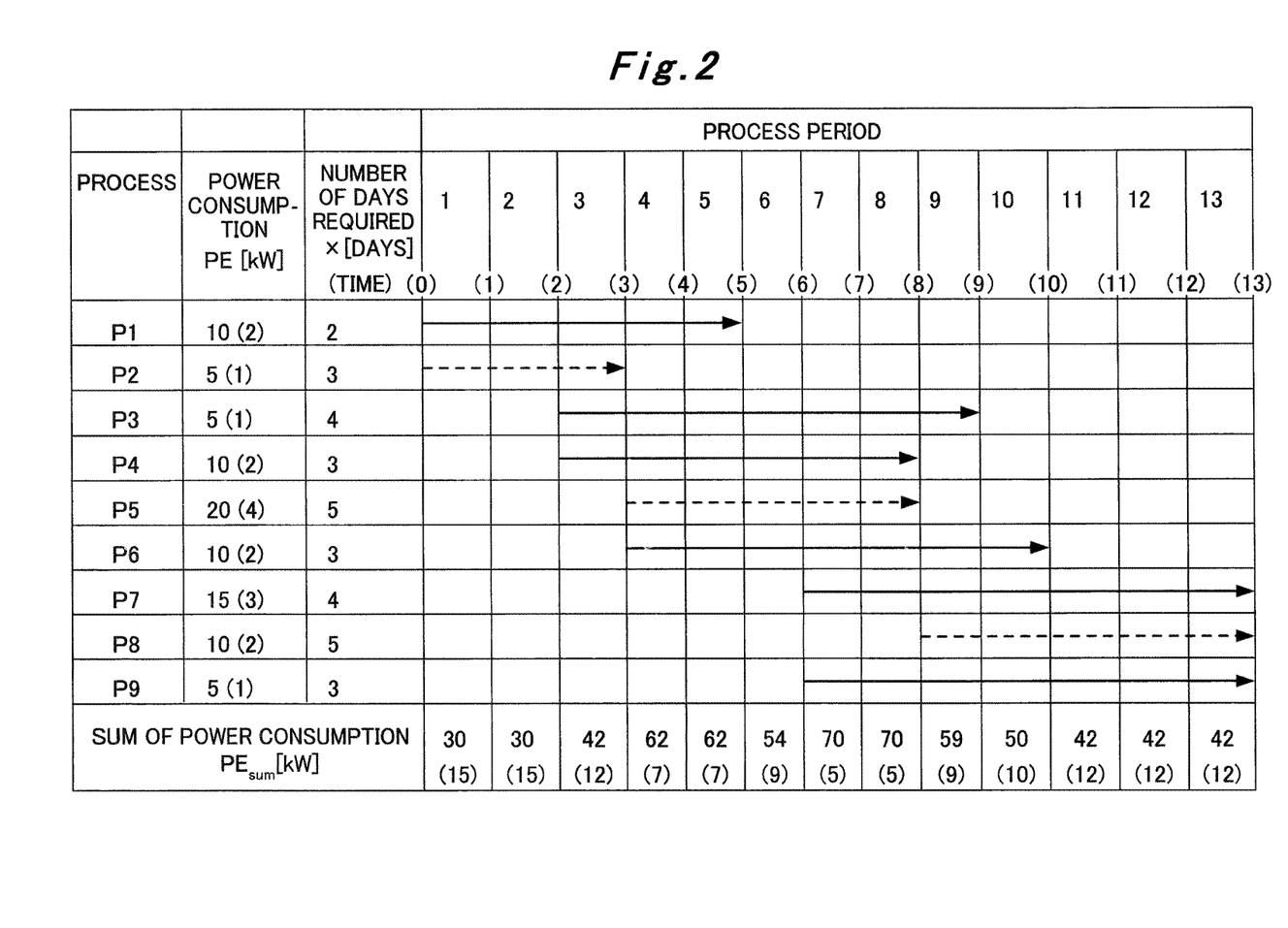
FIG. 2 is a process chart showing a result of a process float analysis based on the PERT analysis chart illustrated in FIG. 1.
Figure 3:
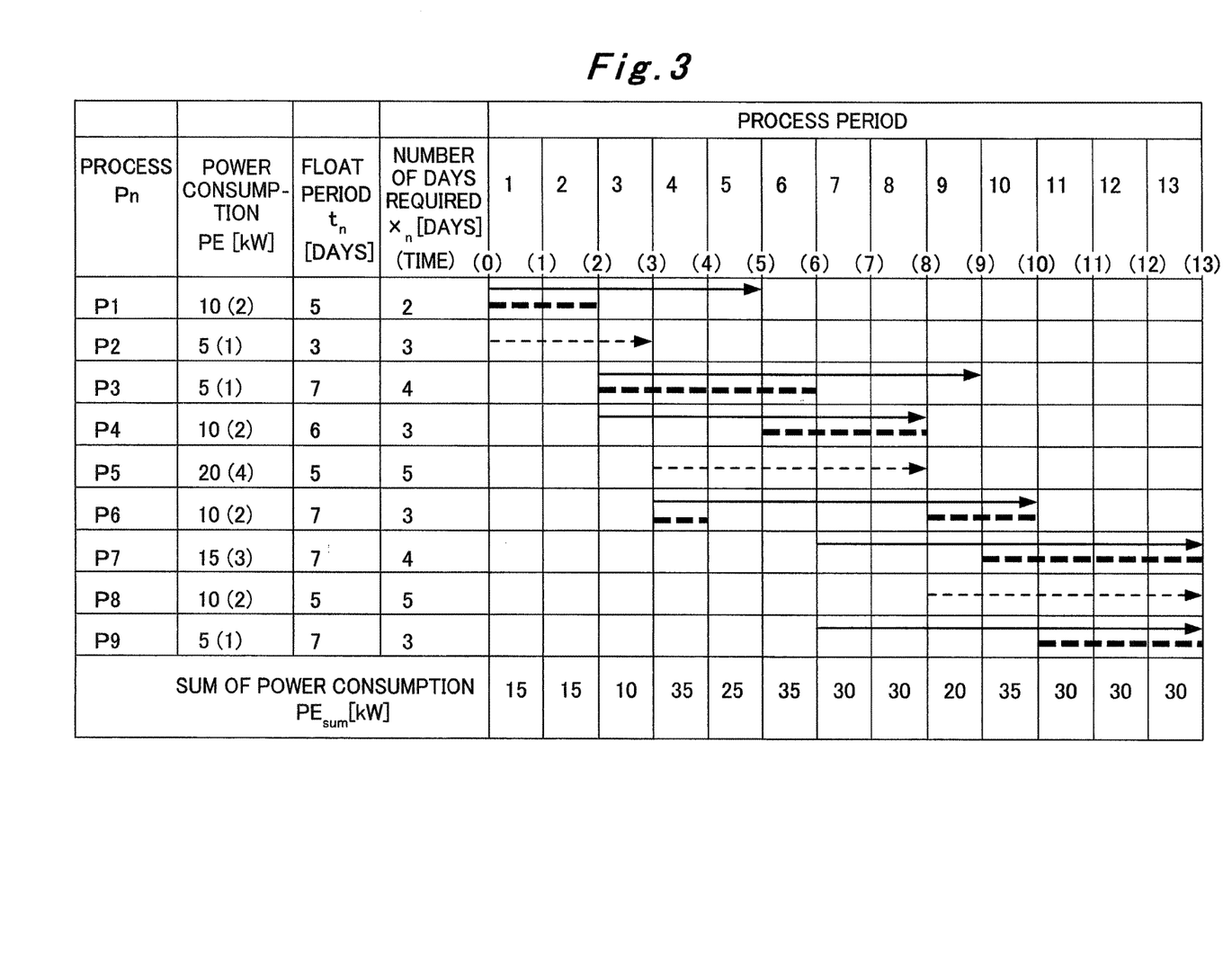
FIG. 3 is a process chart in which processes in the process chart illustrated in FIG. 2 are rearranged in accordance with a combination minimizing a variance with respect to set power.
Figure 4:
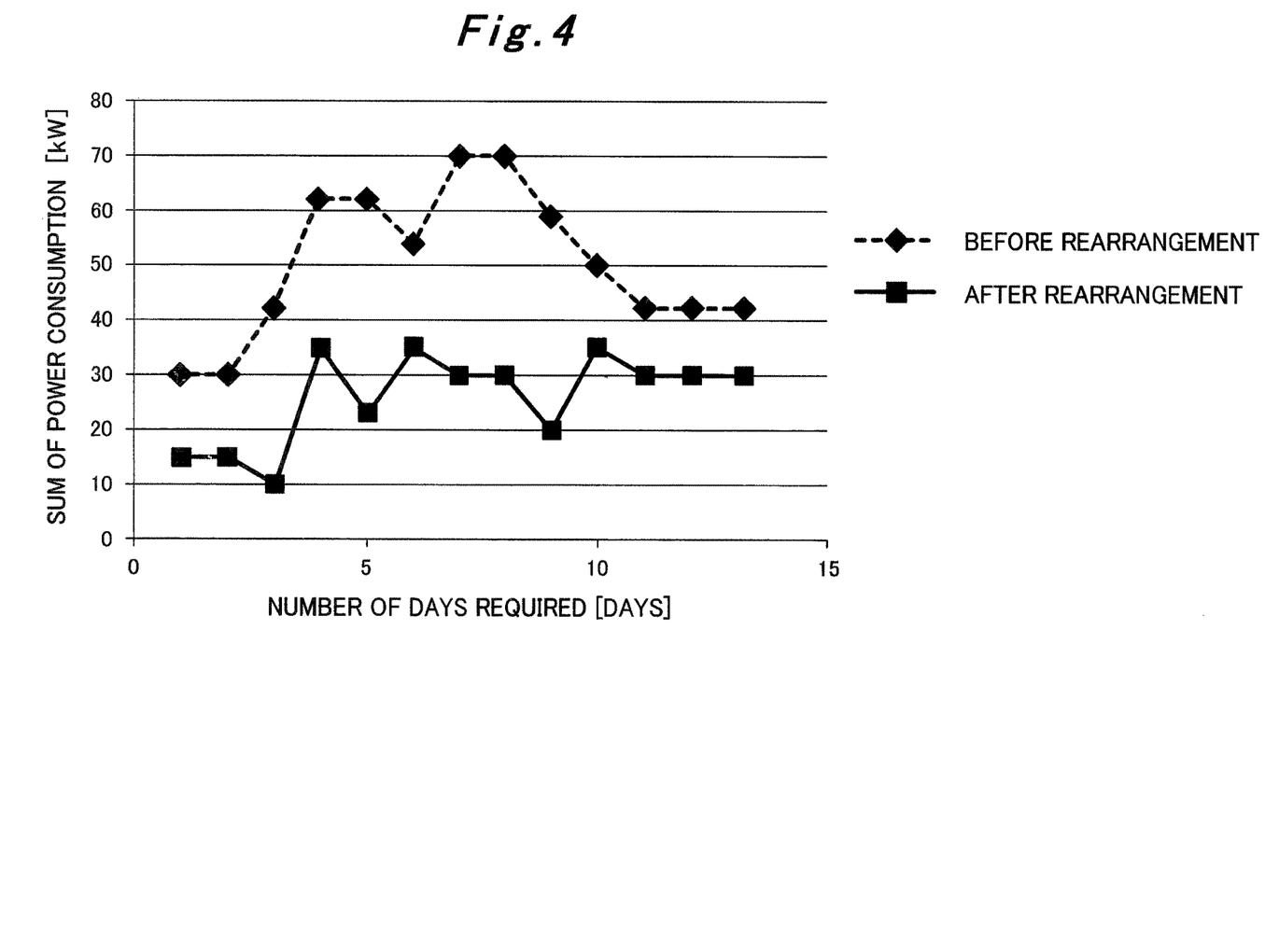
FIG. 4 is a graph for explaining an effect of power reduction by the power consumption control system and the power consumption control method according to the present invention.
Figure 5:
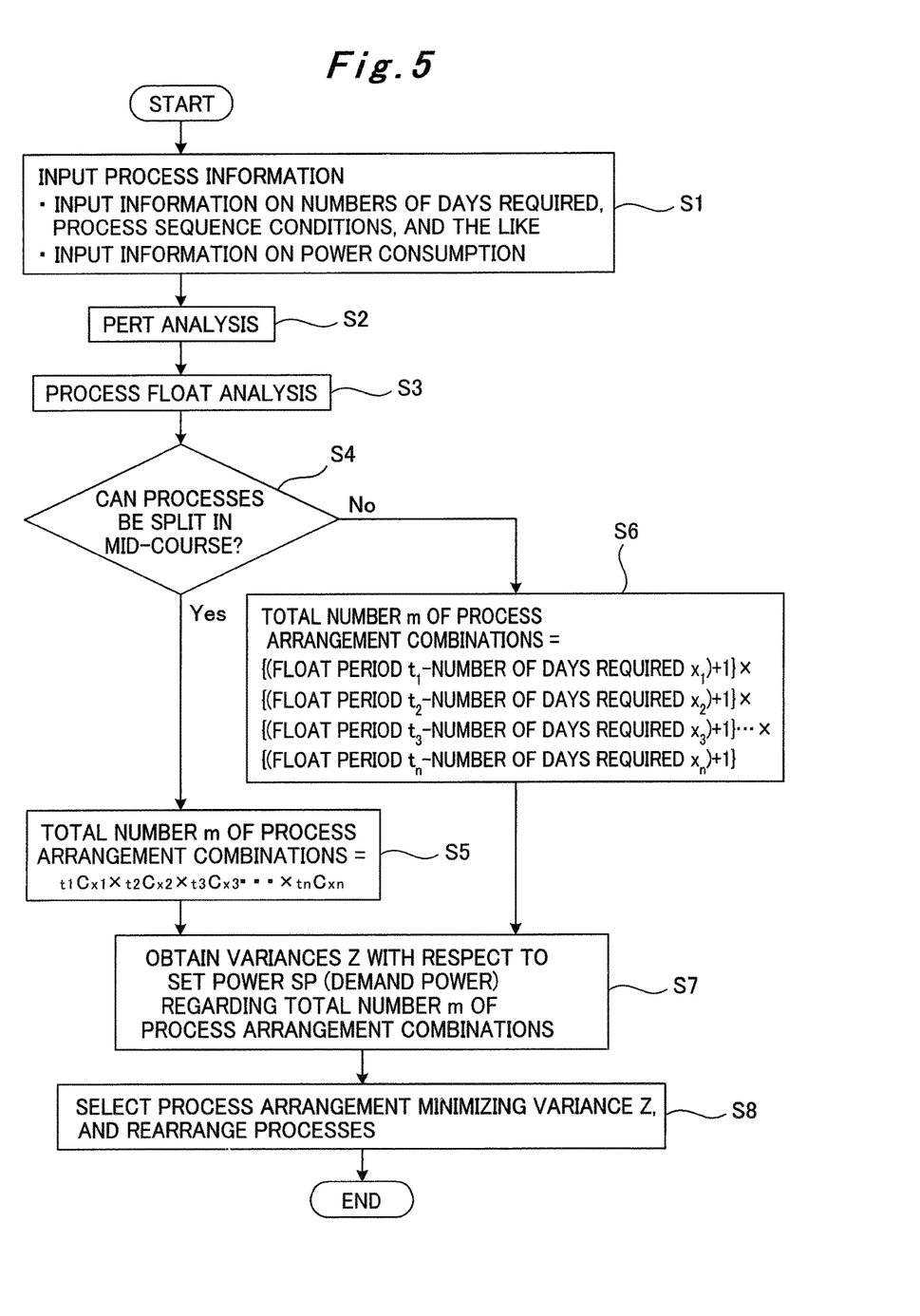
FIG. 5 is a flowchart of process power leveling to be carried out by the power consumption control system and the power consumption control method according to the present invention.

First, a basic concept of the system and the method of power consumption control according to the present invention will be described with reference to FIG. 1 to FIG. 5. Here, FIG. 1 is a PERT analysis chart showing an example of a PERT analysis according to the system and the method of power consumption control of the present invention. Meanwhile, FIG. 2 is a process chart showing a result of a process float analysis based on the PERT analysis chart illustrated in FIG. 1, and FIG. 3 is a process chart in which processes in the process chart illustrated in FIG. 2 are rearranged in accordance with a combination minimizing a variance with respect to set power. In the meantime, FIG. 4 is a graph for explaining an effect of power reduction by the system and the method of power consumption control according to the present invention. Moreover, FIG. 5 is a flowchart of process power leveling to be carried out by the system and the method of power consumption control according to the present invention.

[1. Process Power Leveling]

(Step S1: Inputting Process Information)

Here, in order to explain the basic concept of the system and the method of power consumption control according to the present invention, a description will be given of an example of a production line that involves multiple processes to be carried out by multiple line instruments, in which the production line involves processes, numbers of days required, and power consumption (inclusive of standby power) shown in the following Table 1 and also involves process sequence conditions shown in the following Table 2. These pieces of process information (the numbers of days required, the process sequence conditions, the power consumption, and the standby power) are inputted to a host computer 1 to be described later, and the host computer 1 carries out the following analysis, rearrangement, and the like. On this occasion, possibilities to split the processes are also inputted. Note that although the numbers of days required are defined therein as required periods, such required periods may be replaced by required time (hours and minutes) and the like, for example.

TABLE 1

| | Process | | | | | | | | |
|---|---|---|---|---|---|---|---|---|---|
| | P1 | P2 | P3 | P4 | P5 | P6 | P7 | P8 | P9 |
| Number of days required (days) | 2 | 3 | 4 | 3 | 5 | 3 | 4 | 5 | 3 |
| Power consumption (kW) | 10 | 5 | 5 | 10 | 20 | 10 | 15 | 10 | 5 |
| Standby power (kW) | 2 | 1 | 1 | 2 | 4 | 2 | 3 | 2 | 1 |

TABLE 2

Process Sequence Conditions

Process P1 must be completed in order to carry out process P3 and process P4
Process P2 must be completed in order to carry out process P5 and process P6
Process P3 must be completed in order to carry out process P7
Process P4 and process P5 must be completed in order to carry out process P8
Process P6 must be completed in order to carry out process P9
Final finishing process may take place upon completion of processes P7, P8, and P9 (The final finishing process does not affect an outcome and will therefore be omitted for the sake of convenience)

(Step S2: PERT Analysis)

Results in the PERT analysis chart shown in FIG. 1 are obtained by carrying out a PERT analysis based on the inputted process information (including at least the numbers of days required and the process sequence).

In FIG. 1, processes P1 to P9 are indicated with arrows while multiple nodes (N=1, 2, 3, and so on) to define start times and finish times of the respective processes P1 to P9 are indicated with circles. Moreover, a time (the earliest activity start time) at which an activity of the process to be started from a target node can be started earliest, and a time (the latest activity start time) at which the activity to be started from the target node can be started latest so as to finish the entire processes with the shortest time, are calculated for each of the nodes. An upper row in a square frame near each node indicates the earliest activity start time, and a lower row therein indicates the latest activity start time.

Specifically, at the node 1 serving as a start point, the earliest activity start time is defined as "0" and the latest activity start time is defined as "0". Thereafter, the earliest activity start times for the respective nodes are calculated sequentially from the start point to an end point.

To be more precise, when a calculation target is assumed to be the node 2, for example, a value calculated by adding the number of days required "2" for the process P1 between the node 2 and its immediately preceding node 1 to the earliest activity start time "0" for the immediately preceding node 1 becomes the earliest activity start time "2" for the node 2 as the calculation target. If there are two or more nodes immediately preceding the node as the calculation target, or when the calculation target is assumed to be the node 5, for example, a value calculated by adding the number of days required "3" for the process P4 between the node 5 and an immediately preceding node 2 to the earliest activity start time "2" for the immediately preceding node 2 becomes equal to "5", while a value calculated by adding the number of days required "5" for the process P5 between the node 5 and an immediately preceding node 3 to the earliest activity start time "3" for the immediately preceding node 3 becomes equal to "8". The largest of these values "8" becomes the earliest activity start time "8" for the node 5 as the calculation target.

Thereafter, the latest activity start times are calculated. Here, at the node 7 which is the end point, the earliest activity start time is equal to the latest activity start time. Accordingly, the latest activity start time is defined as "13" based on the earliest activity start time "13", and the latest activity start times for the respective nodes are calculated sequentially from the end point to the start point.

To be more precise, when the calculation target is assumed to be the node 6, for example, a value calculated by subtracting the number of days required "3" for the process P9 between the node 6 and its immediately following node 7 from the latest activity start time "13" for the immediately preceding node 7 becomes the latest activity start time "10" for the node 6 as the calculation target. If there are two or more nodes immediately following the node as the calculation target, or when the calculation target is assumed to be the node 3, for example, a value calculated by subtracting the number of days required "5" for the process P5 between the node 3 and an immediately following node 5 from the latest activity start time "8" for the immediately following node 5 becomes equal to "3", while a value calculated by subtracting the number of days required "3" for the process P6 between the node 3 and an immediately following node 6 from the latest activity start time "10" for the immediately following node 6 becomes equal to "7". The smallest of these values "3" becomes the latest activity start time "3" for the node 3 as the calculation target.

It is clear from the PERT analysis chart in FIG. 1 created as described above, that there are the nodes for which the earliest activity start time is equal to the latest activity start time, and that a path formed by concatenating the corresponding nodes from the start point to the end point constitutes a critical path (dotted arrows). In FIG. 1, the critical path is formed by concatenating the node 1→the node 3 (the process P2), the node 3→the node 5 (the process P5), and the node 5→the node 7 (the process PB).

(Step S3: Process Float Analysis (Indication of Float Periods))

An analysis on float periods is performed based on the results in the PERT analysis chart shown in FIG. 1. Specifically, regarding each of the processes not involved in the critical path, a period between the earliest activity start time for the node at the start of the process and the latest activity start time for the node at the finish of the process is indicated in a process chart shown in FIG. 2. According to the PERT analysis chart shown in FIG. 1, the processes P1, P3, P4, P6, P7, and P9 are the processes not involved in the critical path. Regarding the process P1, for example, a period between the earliest activity start time "0" for the node 1 at the start of the process P1 and the latest activity start time "5" for the node 2 at the finish of the process P1 is indicated. Note that the times in the PERT analysis chart shown in FIG. 1 are indicated in parentheses in the process chart of FIG. 2.

The processes involved in the critical path may also be treated basically in the same manner as the processes not involved in the critical path. Nonetheless, since the earliest activity start time is equal to the latest activity start time in this case, the indication can be made simple. Specifically, a period between the earliest and latest activity start time for the node at the start of the process and the earliest and latest activity start time for the node at the finish of the process only has to be indicated in the process chart shown in FIG. 2. According to the PERT analysis chart shown in FIG. 1, the processes P2, P5, and P8 are the processes involved in the critical path. Regarding the process P2, for example, a period between the earliest and latest activity start time "0" for the node 1 at the start of the process P2 and the earliest and latest activity start time "3" for the node 3 at the finish of the process P2 is indicated.

The periods thus indicted in the process chart of FIG. 2 represent the float periods for the respective processes. For example, the process P1 not involved in the critical path has the float period "5" available for arrangement of the number of days required "2", whereas the process P2 involved in the critical path has the float period "3" available for arrangement of the number of days required "3". Hence, the critical path has no float available for rearranging the processes.

Meanwhile, in the process chart of FIG. 2, a sum of power consumption per unit period in a process period is calculated and displayed based on power consumption PE per unit period in each process (while standby power per unit period is indicated in parentheses in FIG. 2). For example, on the first day of the process period, the processes P1 and P2 are carried out whereas the processes P3 to P9 are in a standby state. Accordingly, the sum of power consumption $PE_{sum}$ is calculated as 10+5+1+2+4+2+3+2+1=30 [kW]. Meanwhile, a sum of the standby power out of the sum of power consumption $PE_{sum}$ is calculated as 1+2+4+2+3+2+1=15 [kW] as indicated in parenthesis in FIG. 2. Note that hourly-average power usage (kW/hour) during operation is employed herein as the power consumption PE per unit period. However, since the unit period of the process periods is on a daily basis, the power consumption PE may be defined as power usage per day (kW/day) instead. In addition, the calculation is made on the assumption that lines are present for each of all the processes, and that all the lines are powered on at all times (either in operation or in a standby state).

Based on the process chart shown in FIG. 2, combinations of the numbers of days required that can be arranged within the float periods for the respective processes are obtained. Then, process arrangement combinations being combinations of all the processes in the aforementioned combinations are obtained. Thereafter, regarding all the process arrangement combinations thus obtained, variances of the sums of power consumption per unit period with respect to set power (demand power) per unit period are obtained. Then, one of the process arrangement combinations minimizing the variance is obtained, and then the processes are rearranged. In this case, a total number of the process arrangement combinations (hereinafter referred to as a total process arrangement combination number) may be mainly calculated by using formulae described below based on two possible cases to be shown below. At this time, the processes on the critical path do not have to be rearranged. Accordingly, these processes may be excluded from the calculation (alternatively, since the number of combinations of the processes on the critical path is "1 way", the calculation may be made by multiplying "1").

(Steps S4→S5: When Process can be Split in Mid-Course)

If the processes can be split in mid-course, or in other words, if required periods of the processes can be split and the processes need not be continuous, then it is an objective to determine which periods among the float periods are to be selected. Accordingly, when the following calculation is performed by using combinations C, it is possible to obtain a total process arrangement combination number m:

$$m = {}_{t1}C_{x1} \times {}_{t2}C_{x2} \times \ldots \times {}_{ti}C_{xi} \times \ldots \times {}_{tn}C_{xn},$$

where n is a total number of the processes, i is a code of an arbitrary process (i is an integer in a range from 1 to n), $x_i$ is the number of days required for an arbitrary process Pi, and $t_i$ is a float period for the arbitrary process Pi.

Based on the process chart shown in FIG. 2, the numbers of combinations in the respective processes are calculated regarding the processes P1, P3, P4, P6, P7, and P9 not involved in the critical path. Regarding the process P1, for example, the float period $t_i$ is equal to 5 days and the number of days required $x_i$ is equal to 2 days. Accordingly, the number of combinations to arrange the number of days required $x_i=2$ days within the float period $t_i=5$ days is calculated as follows:

Process P1: ${}_5C_2=10$ ways.

Likewise, regarding the processes P3, P4, P6, P7, and P9, the numbers of combinations are calculated as follows:

Process P3: ${}_7C_4=35$ ways;
Process P4: ${}_6C_3=20$ ways;
Process P6: ${}_7C_3=35$ ways;
Process P7: ${}_7C_4=35$ ways; and
Process P9: ${}_7C_3=35$ ways.

Though the above-described calculation is also applicable to the processes P2, P5, and P8 involved in the critical path, all the results naturally turn out to be "1 way" as shown below:

Process P2: ${}_3C_3=1$ way;
Process P5: ${}_5C_5=1$ way; and
Process P8: ${}_5C_5=1$ way.

As a consequence, the total process arrangement combination number m is calculated as $10 \times 35 \times 20 \times 35 \times 35 \times 35 = 300{,}125{,}000$ ways.

(Steps S4→S6: When Processes Must be Carried Out Continuously)

If the required periods of the processes cannot be split, and the processes have to be carried out continuously, then it is possible to obtain the total process arrangement combination number m by performing the following calculation:

$$m = \{(t_1-x_1)+1\} \times \{(t_2-x_2)+1\} \times \ldots \times \{(t_i-x_i)+1\} \times \ldots \times \{(t_n-x_n)+1\}.$$

In this case as well, n is the total number of the processes, i is the code of the arbitrary process (i is an integer in a range from 1 to n), $x_i$ is the number of days required for the arbitrary process Pi, and $t_i$ is the float period for the arbitrary process Pi.

Based on the process chart shown in FIG. 2, the numbers of combinations in the respective processes are calculated regarding the processes P1, P3, P4, P6, P7, and P9 not involved in the critical path. Regarding the process P1, for example, the float period $t_i$ is equal to 5 days and the number of days required $x_i$ is equal to 2 days. Accordingly, the number of combinations is calculated as follows:

Process P1: $5-2+1=4$ ways.

Likewise, regarding the processes P3, P4, P6, P7, and P9, the numbers of combinations are calculated as follows:

Process P3: $7-4+1=4$ ways;
Process P4: $6-3+1=4$ ways;
Process P6: $7-3+1=5$ ways;
Process P7: $7-4+1=4$ ways; and
Process P9: $7-3+1=5$ ways.

Although the above-described calculation is also applicable to the processes P2, P5, and P8 involved in the critical path, all the results naturally turn out to be "1 way" as shown below:

Process P2: $3-3+1=1$ way;
Process P5: $5-5+1=1$ way; and
Process P8: $5-5+1=1$ way.

As a consequence, the total process arrangement combination number m is calculated as $4 \times 4 \times 4 \times 5 \times 4 \times 5 = 6{,}400$ ways.

Note that the above-described calculations in steps S4 to S6 are solely based on the assumption either that the required periods can be split in all the processes or that the required period cannot be split in any of the processes. However, the processes for which the required periods can be split and the processes for which the required periods cannot be split may be present at the same time. In such a case, depending on the processes, the number m' of combinations in each step for which the required period can be split is calculated by $[m'={}_{ti}C_{xi}]$, while the number m' of combinations in each step for which the required period cannot be split is calculated by $[m'=(t_i-x_i)+1]$. Then, the total process arrangement combination number m may be calculated by multiplying n pieces of the numbers m' of combinations by one another, where n represents the total number of the processes. In the meantime, it is possible to deal with any types of sets of the processes (sets of the processes for different product groups) by increasing the calculations of the numbers of combinations in each case.

(Step S7: Calculation of Variances Z)

Regarding the process arrangement combinations in the total process arrangement combination number m thus obtained, sums of power consumption per unit period in the process period are obtained, and variances $Z_1, \ldots, Z_j, \ldots, Z_m$ of the sum of power consumption per unit time with respect to set power SP per unit time are obtained. Here, the set power SP is either an upper limit or an average value, of the power consumption desired by a consumer, or demand set power, for example. Meanwhile, values $PE_{sum(ji)}$ to $PE_{sum(jk)}$, represent the sum of power consumption from the first day to the k-th day in the process period involving a j-th process arrangement combination. Here, j is an integer in a range from 1 to m. Regarding the value k, k is equal to 13 in FIG. 3, for example:

Variance $Z_1 =$ $$\sqrt{\{(SP - PE_{sum(11)})^2 + (SP - PE_{sum(12)})^2 + (SP - PE_{sum(13)})^2 + \ldots + (SP - PE_{sum(1k)})^2\}}$$

$\vdots$

Variance $Z_j = \sqrt{\{(SP - PE_{sum(j1)})^2 + (SP - PE_{sum(j2)})^2 + (SP - PE_{sum(j3)})^2 + \ldots + (SP - PE_{sum(jk)})^2\}}$ $\vdots$ Variance $Z_m = \sqrt{\{(SP - PE_{sum(m1)})^2 + (SP - PE_{sum(m2)})^2 + (SP - PE_{sum(m3)})^2 + \ldots + (SP - PE_{sum(mk)})^2\}}$ (Step 8: Selection of Smallest Variance Z and Rearrangement of Processes)

The smallest variance Z is sought in the obtained variances $Z_1, \ldots, Z_j, \ldots, Z_m$, and the process arrangement combination minimizing the variance Z is selected. For example, the smallest variance Z may be obtained by using a function shown below. The smallest variance Z represents the most leveled sum of power consumption per unit period:

Selected process arrangement combination=
$\min\{Z_1, \ldots, Z_j, \ldots Z_m\}$.

Note that only the above-mentioned variance needs to be taken into account in the case where the line instruments are operated only in the number of days required while the standby power is turned off for the rest. On the other hand, in the case where the required period can be split and, once the line instruments are powered on, the power of the line instruments cannot be turned off even if the instruments do not perform any of the processes (when the standby power is consumed), then the process arrangement combination may be selected by taking into account the smallest value of power consumption as well as the above-mentioned variance.

FIG. 3 shows a process diagram, which illustrates the process arrangement combination based on the process chart shown in FIG. 2 and on the process arrangement combination minimizing the variance Z, in the case where the required periods in all the processes can be split. In other words, in the process diagram of FIG. 3, the processes are rearranged in such way as to achieve the combination of the processes which levels the power consumption most. Note that the times in the PERT analysis chart shown in FIG. 1 are also indicated in parentheses in the process chart of FIG. 3. Meanwhile, in FIG. 3, the float periods are indicated with the numbers of days as an example. However, the float periods may be indicated with time (hours and minutes), for instance.

In the process chart of FIG. 3, two days of the first day and the second day are selected for the process P1, four days of the third day, the fourth day, the fifth day, and the sixth day are selected for the process P3, four days of the sixth day, the seventh day, and the eighth day are selected for the process P4, three days of the fifth day, the ninth day, and the tenth day are selected for the process P6, four days of the tenth day, the eleventh day, the twelfth day, and the thirteenth day are selected for the process P7, and three days of the eleventh day, the twelfth day, and the thirteenth day are selected for the process P9.

Particularly, in the process P6, the fourth day is selected as one of the three days of the required days. Thus, the power consumption is leveled more than the case of selecting the sixth to eighth days. In addition, since the operating days of the respective processes are clarified, the days other than the operating days of the respective processes (any period in which the processes are not allocated in the process period for the processes) are also clarified, so that the line instruments can be powered off on the days other than the operating days so as to eliminate the standby power. In other words, it is possible to easily control (on/off of) the standby power since it is clarified when to power off the line instruments.

The process chart of FIG. 3 shows the sum of the power consumption per unit period in the process period calculated based on the power consumption PE per unit period of each process and regarding the selected arrangement process combination. For example, on the first day of the process period, the first process P1 and the second process P2 are carried out while the lines for the processes P3 to P9 are power off to eliminate the standby power. As a consequence, the sum of power consumption $PE_{sum}$ is calculated as 10+5=15 [kW].

The sum of power consumption in the process period in the process chart of FIG. 2 is compared with the power consumption in the process period in the process chart of FIG. 3. A result of the comparison of before and after the rearrangement of the processes is shown in the following Table 3 and in a graph of FIG. 4.

TABLE 3

| | Process period | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Sum of power consumption before rearrangement | 30 | 30 | 42 | 62 | 62 | 54 | 70 | 70 | 59 | 50 | 42 | 42 | 42 |
| | ↓ | ↓ | ↓ | ↓ | ↓ | ↓ | ↓ | ↓ | ↓ | ↓ | ↓ | ↓ | ↓ |
| Sum of power consumption after rearrangement | 15 | 15 | 10 | 35 | 25 | 35 | 30 | 30 | 20 | 35 | 30 | 30 | 30 |

The sum of power consumption before the rearrangement represents the maximum power consumption possible. Although the power consumption does not always reach the exact values in respect of all of the days in the schedule as shown in Table 3 and the graph of FIG. 4, the table and the graph show that the power consumption has a volatility of 70 kW at the maximum if the arrangement of the processes is inappropriate. On the other hand, the sum of power consumption after the rearrangement represents the power consumption which inevitably occurs in all of the days in the schedule. Here, the power consumption is leveled in such a way as to remain within 35 kW at the maximum. Thus, it is clear that the leveling of the power consumption can be achieved by rearranging the processes in accordance with the above-described procedures.

[2. Control of Respective Processes in Accordance with Processes after Rearrangement]

In accordance with the process chart of FIG. 3, the processes P1 to P9 are carried out by using the host computer 1 to be described later, for example, and the line instruments being subject to the processes not in operation are powered off. This control makes it possible to achieve the leveling of the power consumption and the reduction in the standby power.

[3. Suppression of Peak Power Consumption in Processes after Rearrangement]

The leveling of the power consumption and the reduction in the standby power are achieved as described above. Here, if the peak power consumption (instantaneous maximum power consumption) in the power consumption after the leveling exceeds predetermined target power consumption in any of the days of the process period, then the peak power consumption may be suppressed by performing the control using the host computer 1 to be described later, for example, in such a way as to reduce at least one of a rotational acceleration/deceleration rate and a rotational speed of a motor used in the corresponding line instrument.

Although the project-based process management is discussed herein, the embodiment is also adaptable to line-based project management by setting smaller numbers of days required (by the hour or the minute). In other words, an interval between completion of products (pitch time) may be regarded as a critical path, and an analysis may be performed based on the interval. In this case, unit required time is determined by the hour or the minute, so that the control is more like on-off control.

Next, an example of an embodiment of a system to carry out the above-described power consumption control method of the present invention will be described.

Example 1

Figure 6:
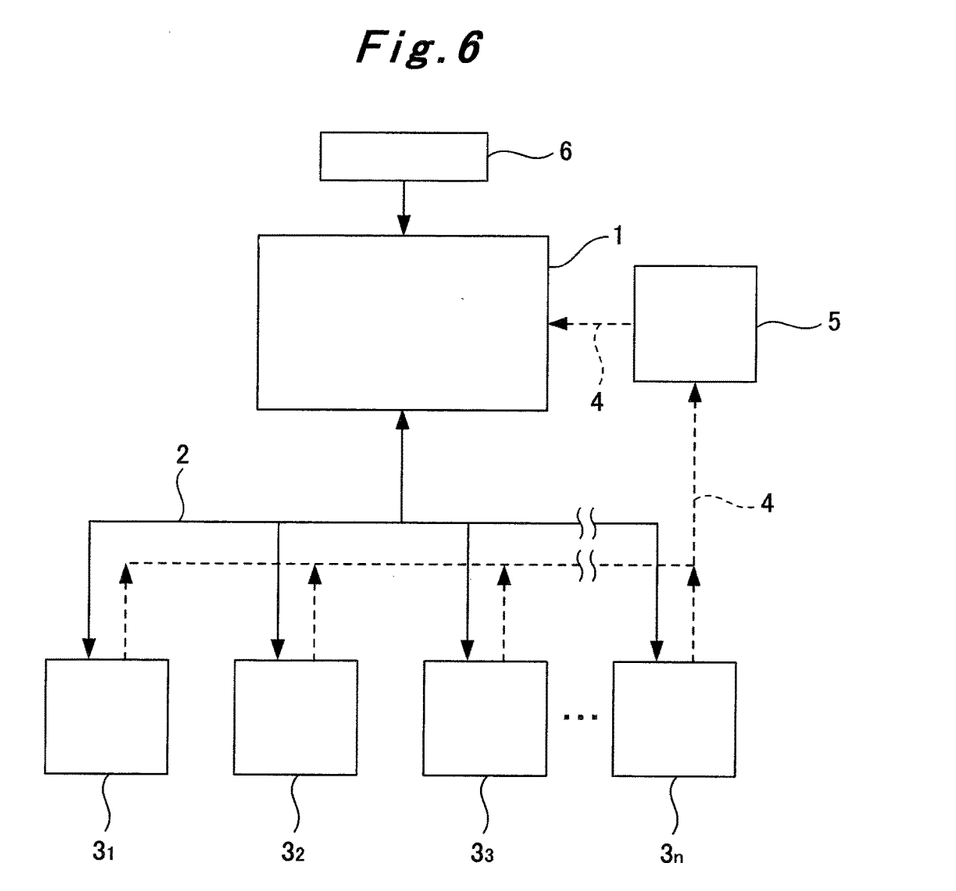
FIG. 6 is a system diagram for explaining an example of an embodiment of the power consumption control system according to the present invention.

FIG. 6 is a system diagram for explaining a power consumption control system of this example. In short, this is a system configured to carry out the above-described power consumption control method ([1. Process Power Leveling], [2. Control of Respective Processes in Accordance with Processes after Rearrangement], and [3. Suppression of Peak Power Consumption in Processes after Rearrangement]) of the present invention.

The power consumption control system of this example includes: the host computer 1 (controlling means) configured to perform prescribed calculation and control by using software; a first communication line 2 to be connected to the host computer 1 and to connect line instruments $3_1$ to $3_n$ to be described later to one another; the plurality of line instruments $3_1$, $3_2$, $3_3$, . . . , and $3_n$ connected to the host computer 1 via the first communication line 2; a power measurement device 5 (power measuring means) configured to measure power consumption of the plurality of line instruments $3_1$ to $3_n$ in real time; a second communication line 4 connecting the line instruments $3_1$ to $3_n$ to the power measurement device 5 and connecting between the power measurement device 5 and the host computer 1; and an input device 6 (inputting means) configured to input information to the host computer 1. Here, for the purpose of facilitating the description, it is to be noted that the line instrument $3_1$ is assumed to carry out the process P1, the line instrument $3_2$ is assumed to carry out the process P2, the line instrument $3_3$ is assumed to carry out the process P3, and so on, and the line instrument $3_n$ is assumed to carry out the process Pn, respectively.

The software for carrying out the above-mentioned [1. Process Power Leveling], [2. Control of Respective Processes in Accordance with Processes after Rearrangement], and [3. Suppression of Peak Power Consumption in Processes after Rearrangement] is created, which is executed by the host computer 1. For example, when the process information is inputted from the input device 6 such as a keyboard, the host computer 1 performs the calculation for leveling the process power, and selects the process arrangement combination that achieves the most leveled power consumption.

Then, based on the selected process arrangement combination, the host computer 1 outputs operation instructions to the applicable line instruments $3_1$ to $3_n$ which are to be operated in one of the processes (or directly controls the operations of the applicable line instruments $3_1$ to $3_n$ to be operated in the one of the processes) via the first communication line 2. At the same time, the host computer 1 outputs stop instructions (power-off instructions) to those of the line instruments $3_1$ to $3_n$ which are not operated in the one of the processes (or directly controls the stop (the power off) of those of the line instruments $3_1$ to $3_n$ not operated in the one of the processes) via the first communication line 2. Thus, the host computer 1 performs either transmission of on/off information to or on/off control of the line instruments $3_1$ to $3_n$. In this way, the process arrangement combination that achieves the most leveled power consumption is selected and carried out, whereby the leveling of the power consumption and the reduction in the standby power are achieved.

In this case, predetermined demand control information (the target power consumption) may also be transmitted to the line instruments $3_1$ to $3_n$ at the same time. The power consumption of each of the line instruments $3_1$ to $3_n$ is inputted to the host computer 1 through the power measurement device 5 and the second communication line 4. The host computer 1 monitors the power consumption in real time. If the peak power consumption (the instantaneous maximum power consumption) exceeds the target power consumption, the instruction to reduce at least one of the rotational acceleration/deceleration rate and the rotational speed of a motor used in any of the line instruments $3_1$ to $3_n$ in operation is outputted by use of the host computer 1. If an applicable one of the equipment $3_1$ to $3_n$ having received the instruction is controlling the motor by using a sequencer embedded in the line instrument, then at least one of the rotational acceleration/deceleration rate and the rotational speed of the motor may be reduced by controlling the sequencer. By performing the above-described control, it is possible to reduce the peak power consumption equal to or below the target power consumption.

INDUSTRIAL APPLICABILITY

The present invention is suitable for management and control of power consumption in a factory, and is capable of playing a role in the field of FEMS (factory energy management systems) whose needs are expected to grow in the future.

REFERENCE SIGNS LIST

1 HOST COMPUTER
2 FIRST COMMUNICATION LINE
$3_1$ TO $3_n$ LINE INSTRUMENT
4 SECOND COMMUNICATION LINE
5 POWER MEASUREMENT DEVICE
6 INPUT DEVICE

The invention claimed is:

1. A power consumption control method comprising:
performing a PERT analysis, the PERT being an acronym for Program Evaluation and Review Technique, regarding a production line provided with a plurality of processes to be carried out by a plurality of line instruments, on a process period of the production line based on process information including at least
a required period of each of the processes, and
a sequence of the processes;
performing a process float analysis to obtain a float period for each of the processes based on the PERT analysis;
obtaining combinations of the required periods arrangeable within the float periods for the respective processes based on the process float analysis, then obtaining process arrangement combinations being combinations of all the processes used in the combinations of the required periods, and obtaining a total process arrangement combination number being a total number of the process arrangement combinations;
obtaining a sum of power consumption per unit period of the process period for each of the process arrangement combinations based on power consumption per unit period of each of the processes, and obtaining a variance of the sum with respect to set power per unit period being set to the process period, thus obtaining the variances for the total process arrangement combination number;
selecting one of the process arrangement combinations which minimizes the variance among all the variances obtained; and
controlling progress of the plurality of processes based on the selected process arrangement combination, and turning off power of the line instrument to carry out a process which is not allocated during any period in the process period for the plurality of processes.

2. The power consumption control method according to claim 1, wherein
the power consumption of each of the plurality of line instruments is measured in real time, and
when the measured power consumption exceeds the set power, which is set in advance, at least one of a rotational acceleration/deceleration rate and a rotational speed of a motor used in the corresponding line instrument is reduced so as not to cause the power consumption to exceed the target power.

3. A power consumption control system comprising:
inputting means for inputting process information regarding a production line provided with a plurality of processes to be carried out by a plurality of line instruments, the process information including at least
a required period of each of the processes,
a sequence of the processes, and
power consumption per unit period of each of the processes; and
controlling means for controlling the plurality of line instruments based on the process information inputted from the inputting means, and
the controlling means
performs a PERT analysis, the PERT being an acronym for Program Evaluation and Review Technique, on the process period for the production line based on at least the required periods and the sequence of the processes,
performs a process float analysis to obtain a float period for each of the processes based on the PERT analysis,
obtains combinations of the required periods arrangeable within the float periods for the respective processes based on the process float analysis, then obtains process arrangement combinations being combinations of all the processes used in the combinations of the required periods, and obtains a total process arrangement combination number being a total number of the process arrangement combinations,
obtains a sum of power consumption per unit period of the process period for each of the process arrangement combinations based on the power consumption, and obtains a variance of the sum with respect to set power per unit period being set to the process period, thus obtaining the variances for the total process arrangement combination number,
selects one of the process arrangement combinations which minimizes the variance among all the variances obtained; and
controls the plurality of line instruments in such a way as to control progress of the plurality of processes based on the selected process arrangement combination, and turn off power of the line instrument to carry out a process which is not allocated during any period in the process period for the plurality of processes.

4. The power consumption control system according to claim 3, wherein
the system further comprises power measuring means for measuring power consumption of each of the plurality of line instruments in real time, and inputting the measured power consumption to the controlling means, and
when the measured power consumption exceeds the set power, which is set in advance, the controlling means performs control in such a way as to reduce at least one of a rotational acceleration/deceleration rate and a rotational speed of a motor used in the corresponding line instrument so as not to cause the power consumption to exceed the target power.

* * * * *